(12) United States Patent
Edwards et al.

(10) Patent No.: US 7,567,099 B2
(45) Date of Patent: Jul. 28, 2009

(54) FILTERLESS DIGITAL FREQUENCY LOCKED LOOP

(75) Inventors: Timothy Stephen Edwards, Fordingbridge (GB); Donald Bruce Boyd, Lymington (GB)

(73) Assignee: Dialogic Corporation, Montreal, Quebec (CA)

( * ) Notice: Subject to any disclaimer, the term of this patent is extended or adjusted under 35 U.S.C. 154(b) by 0 days.

(21) Appl. No.: 11/742,841

(22) Filed: May 1, 2007

(65) Prior Publication Data

US 2008/0272810 A1 Nov. 6, 2008

(51) Int. Cl.
*H03L 7/00* (2006.01)
(52) U.S. Cl. .......................................... 327/145; 327/48
(58) Field of Classification Search ........................ None
See application file for complete search history.

(56) References Cited

U.S. PATENT DOCUMENTS 5,459,435 A * 10/1995 Taki ............................ 331/1 A
5,828,678 A * 10/1998 Mock .......................... 714/815
6,525,578 B2 2/2003 Ooishi
7,158,602 B2 * 1/2007 Noguchi ..................... 375/376
7,304,523 B2 * 12/2007 Yen ............................ 327/291
2004/0056724 A1 3/2004 Arp

OTHER PUBLICATIONS

Mutagi, R.N., Pseudo Noise Sequences for Engineers, Electronics & Communication Engineering Journal, Apr. 1996, pp. 79-87.

* cited by examiner

*Primary Examiner*—Cassandra Cox
(74) *Attorney, Agent, or Firm*—Weingarten, Schurgin, Gagnebin & Lebovici LLP

(57) ABSTRACT

A frequency and/or phase locked loop architecture that eliminates the loop filter generally required in conventional phase locked loops, and which may be implemented in digital logic, for example, as a field programmable gate array. In one example, a frequency/phase locked loop includes both a frequency comparison component and a phase comparison component to allow locking of an output clock signal to both the frequency and phase of a reference signal.

20 Claims, 4 Drawing Sheets

FILTERLESS DIGITAL FREQUENCY LOCKED LOOP

BACKGROUND

1. Field of Invention

This present invention is directed to phase and/or frequency locked loops, more particularly, to filterless digital phase and/or frequency lock loops.

2. Discussion of Related Art

As is well known in the electrical arts, a phase-locked loop (PLL) is a closed-loop feedback control system that generates and outputs a signal in relation to the frequency and phase of an input signal referred to in the art as a "reference" signal. Phase locked loops are widely used for synchronization and other purposes in a variety of applications. For examples, phase locked loops are used in communications for coherent carrier tracking, for bit or symbol synchronization, as master clock synthesizers for microprocessors, and in frequency synthesizers to generate new frequencies that are multiples of the reference signal frequency.

A phase-locked loop circuit responds to both the frequency and the phase of the input signals by automatically raising or lowering the frequency of a controlled oscillator until it is matched to the reference signal in both frequency and phase. Referring to FIG. 1, a block diagram shows one example of a conventional phase locked loop. The phase locked loop 100 includes a frequency synthesizer 102 that generates an output clock signal on line 104 from signal provided by a local oscillator 106, as known to those skilled in the art. The output clock signal is fed to a divide-by-N circuit 108, which produces a feedback signal having a frequency that is a multiple (1/N) of the frequency of the output clock signal. This feedback signal is fed to an error detector 110 which also receives a reference signal via line 112. The error detector 110 provides an error signal based on differences between the phase of the reference signal and the feedback signal. This error signal is filtered by a loop filter 114 (such as an FIR or IIR filter) and provided to the frequency synthesizer 102. Based on the error signal, the frequency synthesizer adjusts the phase and/or frequency of the output signal so as to maintain a lock with the reference signal.

The loop filter 114 is generally required to filter the error signal to stabilize the loop 100 and to reduce jitter in the output clock signal. In many instances, if the frequency synthesizer 102 were to adjust the output clock signal to compensate for the entire measured phase error during every cycle, a significant amount of jitter would be visible on the output clock signal. Therefore, the loop filter 114 is provided to reduce or eliminate components of the error signal in order to make the output clock corrections smaller, thereby reducing high frequency jitter on the output clock.

SUMMARY OF INVENTION

As discussed above, conventional phase locked loops normally require a loop filter to provide stability and to reduce jitter. Aspects and embodiments are directed to architectures for digital frequency and/or phase locked loops that provide for the elimination of the loop filter. Because, according to one embodiment, the need for a separate loop filter is eliminated, the number of components required is reduced. Further, elimination of the loop filter reduces the complexity and size of the circuit, allowing for a more compact and less expensive circuit implementation.

According to one embodiment, a frequency locked loop may comprise a digital frequency synthesizer having a first synthesizer input and being constructed and arranged to generate an output clock signal. The frequency locked loop may further comprise a first counter having a first counter input to receive a reference clock signal and a second counter input to receive a system clock signal, the first counter being constructed and arranged to provide at a first counter output a first count of a number of periods of the system clock signal within at least one period of the reference clock signal. The frequency locked loop may also comprise a second counter having a third counter input to receive the output clock signal and a fourth counter input to receive the system clock signal, the second counter being constructed and arranged to provide at a second counter output a second count of a number of periods of the system clock signal within at least one period of the output clock signal. A comparator may be coupled to the first and second counter outputs and constructed and arranged to compare the first count with the second count and to provide at a comparator output a frequency error signal based on the comparison. The comparator output is coupled to the first synthesizer input to provide the frequency error signal to the digital frequency synthesizer, and the digital frequency synthesizer is constructed and arranged to provide a modified output clock signal based on the frequency error signal.

In one example, a local oscillator may provide the system clock signal to the counters as well as to the digital frequency synthesizer. In addition, the frequency locked loop may further comprise a divide-by-N circuit coupled between the output of the digital frequency synthesizer and the fourth counter input. The divide-by-N circuit may be constructed and arranged to receive the output clock signal and to divide the output clock signal by N to provide a feedback clock signal. In this example, the fourth counter input receives the feedback clock signal, and the second counter is constructed and arranged to provide at the second counter output the second count of the number of periods of the system clock signal within at least one period of the feedback clock signal.

In another example, the frequency locked loop may further comprise a lead-lag detector having a first input coupled to the output of the divide-by-N circuit to receive the feedback clock signal and a second input to receive the reference clock signal. The lead-lag detector may be constructed and arranged to provide at an output a phase error signal. The frequency locked loop may further comprise an adder coupled between the comparator and the digital frequency synthesizer. The adder may be constructed and arranged to receive and add the frequency error signal and the phase error signal and to provide at an adder output a combined error signal. The digital frequency synthesizer may receive the combined error signal at the first synthesizer input and provide the modified output clock signal based on the combined error signal. In this example, the frequency locked loop may provide both frequency and phase locking of the output clock signal to the reference clock signal, or a multiple thereof. In one example, the frequency locked loop may further comprise an amplifier coupled between the output of the comparator and the adder. The amplifier may be constructed and arranged to provide a constant gain factor to the frequency error signal. The frequency locked loop may be implemented in a field programmable gate array, as one example.

Another embodiment is directed to a method comprising counting a first number of cycles of a system clock signal within one period of a reference signal, counting a second number of cycles of the system clock signal within at least one period of an output clock signal, comparing the first number of periods with the second number of periods to provide a frequency error signal, and adjusting the output clock signal based on the frequency error signal.

In one example of the method, counting the first and/or second number of cycles may include counting the first and/or second number of cycles occurring between adjacent rising edges of the respective reference signal and/or output clock signal. In another example, the method may further comprise comparing a first phase of the output clock signal with a second phase of the reference signal to provide a phase error signal. In this example, adjusting the output clock signal may include adjusting a frequency and a phase of the output clock signal based on a combination of the frequency error signal and the phase error signal. In another example, the method may further comprise multiplying the frequency error signal by a constant gain factor.

According to another embodiment, a phase locked loop may comprise a digital frequency synthesizer constructed and arranged to generate an output clock signal, and means for generating a frequency error signal based on a difference in frequency between the output clock signal and a reference signal. The phase locked loop may further comprise a lead/lag detector constructed and arranged to receive the output clock signal and the reference signal, and to generate a phase error signal based on a difference in phase between the output clock signal and the reference signal. The phase locked loop may also comprise an adder constructed and arranged to receive and add the frequency error signal and the phase error signal and to provide a combined error signal. The digital frequency synthesizer may be further constructed and arranged to receive the combined error signal and to adjust a frequency and phase of the output clock signal based on the combined error signal.

In one example, the phase locked loop may further comprise an amplifier having an output coupled to an input of the adder. The amplifier may be constructed and arranged to receive the frequency error signal, to apply to the frequency error signal a constant gain factor, and to provide at the output an amplified frequency error signal. In another example, the means for generating the frequency error signal may comprise a first counter having a first counter input to receive the reference signal and a second counter input to receive a system clock signal. The first counter may be constructed and arranged to provide at a first counter output a first count of a number of periods of the system clock signal within at least one period of the reference signal. The means for generating the frequency error signal may also comprise a second counter having a third counter input to receive the output clock signal and a fourth counter input to receive the system clock signal. The second counter may be constructed and arranged to provide at a second counter output a second count of a number of periods of the system clock signal within at least one period of the output clock signal. The means for generating the frequency error may further comprise a comparator coupled to the first and second counter outputs. The comparator may be constructed and arranged to compare the first count with the second count and to provide at a comparator output the frequency error signal based on the comparison.

Still other aspects, embodiments, and advantages of these exemplary aspects and embodiments, are discussed in detail below. Moreover, it is to be understood that both the foregoing information and the following detailed description are merely illustrative examples of various aspects and embodiments, and are intended to provide an overview or framework for understanding the nature and character of the claimed aspects and embodiments. The accompanying drawings are included to provide illustration and a further understanding of the various aspects and embodiments, and are incorporated in and constitute a part of this specification. The drawings, together with the remainder of the specification, serve to explain principles and operations of the described and claimed aspects and embodiments.

BRIEF DESCRIPTION OF DRAWINGS

Various aspects of at least one embodiment are discussed below with reference to the accompanying figures. In the figures, which are not intended to be drawn to scale, each identical or nearly identical component that is illustrated in various figures is represented by a like numeral. For purposes of clarity, not every component may be labeled in every drawing. The figures are provided for the purposes of illustration and explanation and are not intended as a definition of the limits of the invention. In the figures.

DETAILED DESCRIPTION

Aspects and embodiments are directed toward architectures for digital frequency and/or phase locked loops which eliminate the loop filter normally required in conventional phase locked loops to provide stability and jitter attenuation. These architectures may reduce the complexity of the digital frequency/phase locked loop circuitry, allowing for a more compact implementation, for example, in digital logic. Thus, according to various aspects and embodiments, there may be provided a compact implementation of a high performance digital frequency/phase locked loop in a field programmable gate array (FPGA) or custom silicon design, as discussed further below. Such digital frequency/phase locked loops may be used in many products and applications, for example, to facilitate network synchronization in telecommunications products specified according to the well known ITU-T recommendations G.823 and G.824.

It is to be appreciated that embodiments of the methods and apparatus discussed herein are not limited in application to the details of construction and the arrangement of components set forth in the following description or illustrated in the accompanying drawings. The methods and apparatus are capable of implementation in other embodiments and of being practiced or of being carried out in various ways. Examples of specific implementations are provided herein for illustrative purposes only and are not intended to be limiting. In particular, acts, elements and features discussed in connection with any one or more embodiments are not intended to be excluded from a similar role in any other one or more embodiments. Also, the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

Figure 2:
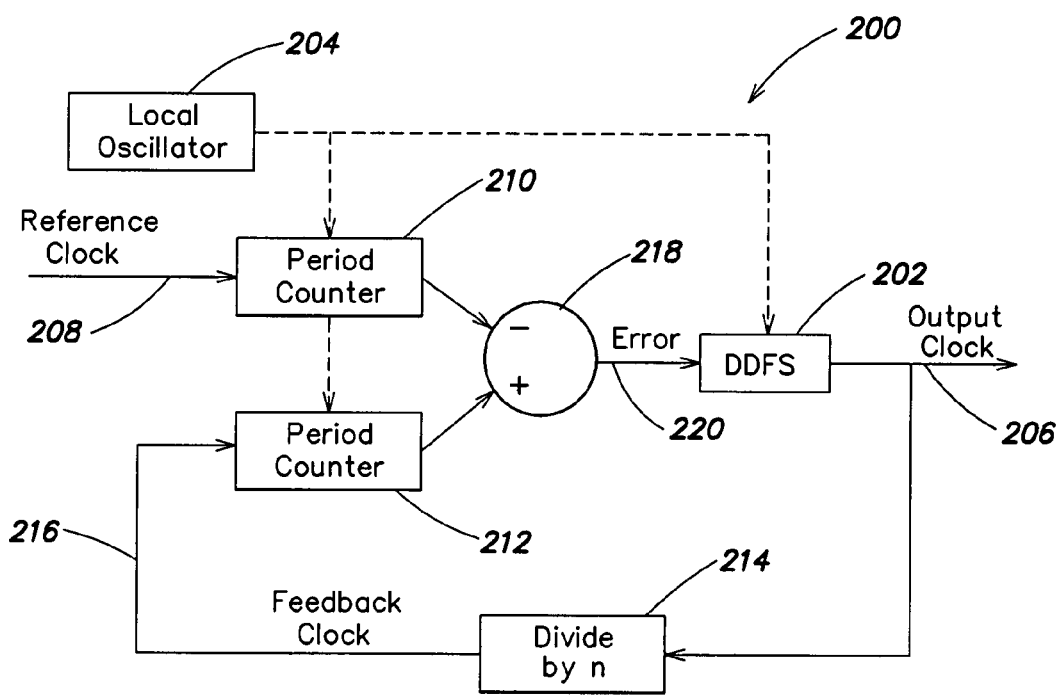
FIG. 2 is a block diagram of one embodiment of a digital frequency locked loop.

Referring to FIG. 2, there is illustrated a block diagram of one embodiment of a digital filterless frequency locked loop. The frequency locked loop 200 may comprise a frequency synthesizer 202 which receives a system clock signal from a local oscillator 204 and generates an output clock signal provided on line 206. The frequency locked loop 200 operates to lock a frequency of the output clock signal to a multiple of the frequency of a reference clock signal which is input to the loop on line 208. To accomplish the frequency lock, the output clock signal is fed back into the loop, via an optional divide-by-N circuit 214, as a feedback clock signal on line 216. The divide-by-N circuit 214 makes the output clock signal a factor of n faster than the reference clock signal. A non-integer value of n may be implemented as a combination of multiply and divide blocks. The frequency of the feedback clock signal is compared to the frequency of the reference clock signal, as discussed below, and an error signal is generated based on the comparison. The error signal is provided to the frequency synthesizer 202 on line 220. Based on the error signal, the frequency synthesizer 202 may adjust the frequency of the output clock signal, as discussed below, to maintain the lock with the reference clock signal.

Still referring to FIG. 2, the frequency locked loop 200 may comprise two counters 210 and 212. These counters 210, 212 may be used to compare the frequencies of the feedback clock signal and the reference clock signal. The first counter 210 has a first input to receive the system clock signal from the local oscillator 204 and a second input to receive the reference clock signal. Similarly, the second counter 212 includes a third input to receive the system clock signal and a fourth input to receive the feedback clock signal. In one embodiment, each counter 210, 212 counts the number of system clock cycles between adjacent rising edges of its respective input clock signal. Thus, the first counter 210 counts the number of system clock cycles between adjacent rising edges of the reference clock signal, and the second counter 212 counts the number of system clock cycles that occur between adjacent rising edges of the feedback clock signal. It is to be appreciated however, that the methods and apparatus are not limited to counting based on the rising edges of the input clock and other configurations are also possible. For example, the counters 210, 212 may count the number of system clock cycles between falling edges, center points or other reference points in the input clock cycles. In addition, the counters 210, 212 may count the number of system clock cycles that occur within one or more periods of the respective input clocks.

After the two counts of the system clock cycles have been obtained, the counts may be provided to the inputs of a comparator 218. The comparator 218 compares the two counts and generates the error signal based on the comparison. This error signal is a measure of the difference between the frequency of the reference clock signal and the frequency of the feedback clock signal. For example, if counter 210 counts a higher number of system clock cycles during one or more periods of the reference clock signal than the number of system clock cycles counted by counter 212 during the one or more periods of the feedback clock signal, this indicates that the feedback clock signal is at a lower frequency than the reference clock signal. Thus, the error signal, which is supplied to the frequency synthesizer 202 on line 220, may indicate that the frequency synthesizer 202 should increase the frequency of the output clock signal to compensate for the detected difference in frequency between the reference clock signal and the feedback clock signal.

The resolution of the counters 210, 212, and thus of the error signal, is limited by the frequency of the system clock signal from the local oscillator 204. A faster system clock provides better counter resolution. In one example, the system clock frequency may be selected based on the maximum tolerable jitter on the output clock signal. Jitter may be induced on the output clock signal by the system clock through variation in the output clock edge compared to an ideal position of the edge. The edge-to-edge jitter induced on the output clock signal is related to the system clock period. For example, if the maximum tolerable edge-to-edge jitter on the output clock signal is 10.5 nanoseconds (ns), then the frequency of the system clock signal must be greater than or equal to 95.24 megahertz (MHz), from the relationship:

$$t_j = \frac{1}{f_s} \quad (1)$$

where: $t_j$ is the maximum tolerable jitter; and
$f_s$ is the system clock frequency.

The maximum tolerable edge-to-edge jitter may be determined by a standard with which the system in which the frequency locked loop 200 is used must comply (e.g., a telecommunications standard), or by design parameters for the system in which the frequency locked loop 200 is being used.

In one embodiment, the frequency synthesizer 202 may be a direct digital frequency synthesizer. Direct digital synthesis (DDS) is a method of producing an analog waveform, for example, a sine wave, by generating a time-varying signal in digital form and then performing a digital-to-analog conversion. The following example and discussion assumes that the frequency synthesizer is configured to produce a sine wave. However, it is to be appreciated that the apparatus is not so limited and the frequency synthesizer may instead be configured to produce a variety of other waveforms, such as, for example, a square wave or sawtooth function.

Figure 3:
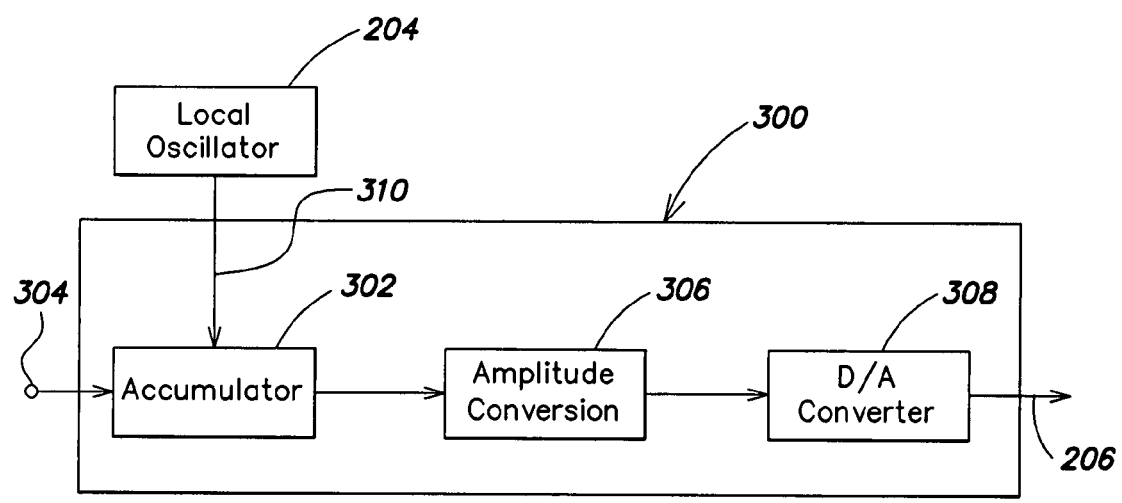
FIG. 3 is a block diagram of one example of a direct digital frequency synthesizer.

Referring to FIG. 3, there is illustrated a block diagram of one example of a direct digital frequency synthesizer 300 including an accumulator 302, an amplitude generator 306 and a digital-to-analog converter 308. The amplitude generator 306 typically may be implemented as a look-up table. The digital frequency synthesizer 300 produces a waveform (e.g., a sine wave) at a given frequency. This frequency depends on two variables, namely the frequency of the system clock signal supplied on line 310 and tuning word supplied at input 304. In one example, the accumulator 302 may be a k-bit modulo-M counter that increments a stored number each time it receives a system clock pulse. The magnitude of the increment is determined by the binary-coded input tuning word (M). The amplitude generator 306 is used to convert the accumulator's k-bit instantaneous output into the sine-wave amplitude information that is presented to the digital-to-analog converter 308.

In one example, the accumulator 302 may compute a phase address for the look-up table of the amplitude generator 306 which outputs the digital value of the amplitude corresponding to the sine of that phase. The digital-to-analog converter 308, in turn, converts the digital value of the amplitude to a corresponding value of analog voltage or current. To generate a fixed-frequency sine wave, a constant value, namely the phase increment which is determined by the tuning word, is added to the phase accumulator 302 with each clock cycle of the system clock (provided by the local oscillator 204). Thus, the tuning word forms the phase step size between system-clock updates. If the phase increment is large, the phase accumulator 302 will step quickly through the sine look-up table and thus generate a high frequency sine wave. If the phase increment is small, the phase accumulator 302 will take many more steps, accordingly generating a slower waveform.

According to one embodiment, the error signal produced by the comparator 218 (see FIG. 2) may be added to the accumulator constant, $C_A$, of the accumulator 302 of the direct digital frequency synthesizer 300. This addition of the error signal may cause a small change in the frequency of the output clock signal. In one example, the accumulator constant, $C_A$, may be limited to a pre-set or variable range to improve the lock time of the loop and/or to prevent the output frequency from varying outside of a desired range. In another example, the accumulator constant may be "frozen" at its current value, e.g., by suspending the update mechanism in the direct digital frequency synthesizer 300, if an invalid reference clock signal is detected. This may provide a hold-over mechanism to generate a valid output clock signal until a valid reference clock signal returns.

With direct digital frequency synthesis, the frequency of the output clock signal may be set with arbitrary precision. This precision may be determined by the width of the accumulator 302 (i.e., the number of bits, k) used in the direct digital frequency synthesizer 300. In one example, the width of the accumulator may be selected such that it gives sufficient frequency resolution ($f_{res}$) of the output clock signal when the accumulator constant, $C_A$, is changed by addition of the error signal. In this case, the width of the accumulator may be calculated using the following equation:

$$f_{out} = C_A * \frac{f_s}{2^k} \quad (2)$$

where: $f_s$ is the system clock frequency;
$f_{out}$ is the output clock frequency; and
k is the width of the accumulator (in number of bits).

Taking the derivative of equation (2) with respect to $C_A$ gives:

$$\frac{d(f_{out})}{d(C_A)} = \frac{f_s}{2^k} \quad (3)$$

Setting $dC_A=1$, $d(f_{out})$ is the desired frequency resolution, $f_{res}$:

$$f_{res} = \frac{f_s}{2^k} \quad (4)$$

Thus, the width, k, of the accumulator can be calculated by solving equation (4) for k:

$$k \geq \frac{\log\left(\frac{f_s}{f_{res}}\right)}{\log(2)} \quad (5)$$

Equation (5) provides a minimum value for k to achieve a desired frequency resolution. However, a larger value for k may be selected, if desired. In one example, the width of the accumulator may be chosen such that the change in frequency caused by the addition of the error signal may be very small compared to the change in frequency that would be required synchronize the next rising edge of the feedback clock with the rising edge of the reference clock. In this example, the total, larger error between the feedback clock signal and the reference clock signal may be slowly reduced or eliminated over several cycles. Thus, the loop may compensate for drift in the frequency of the output clock with respect to the reference clock without causing frequent large changes in the output clock signal. By using this successive approximation method, the average output frequency may be set with arbitrary precision, while providing attenuation of high frequency jitter and tracking of low frequency jitter (wander). In one example, the frequency error between a jitter-free reference clock and the output clock may decay exponentially over time.

Other aspects and embodiments are directed to a phase locked loop. In one embodiment, the phase locked loop may incorporate the frequency locked loop 200, or at least components thereof, discussed above, thus providing a loop that provides both a frequency comparison component and a phase comparison component. The phase comparison component may prevent phase errors from accumulating over time. This may be used, for example, to prevent frame slips from occurring between the receive and transmit clocking domains in a telecommunications system.

Figure 4:
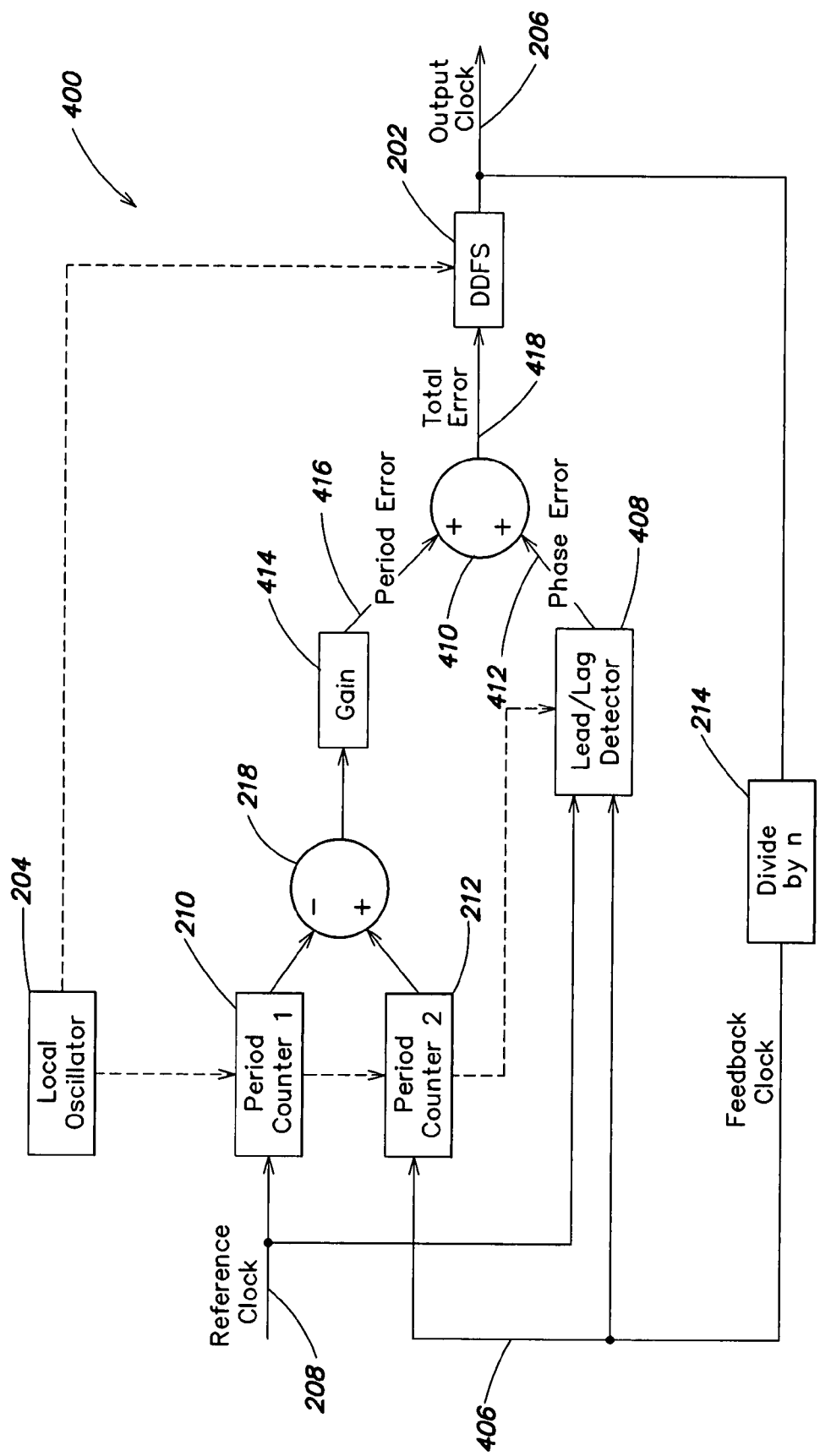
FIG. 4 is a block diagram of one embodiment of a digital phase-locked loop.

Referring to FIG. 4, there is illustrated a block diagram of one embodiment of a phase locked loop. As was the case for the frequency locked loop discussed above, the phase locked loop 400 may include a frequency synthesizer 202 that generates the output clock signal on line 206. In at least one embodiment, the frequency synthesizer 202 may be a direct digital frequency synthesizer, as discussed above. The phase locked loop 400 may include the first and second counters 210, 212 that respectively receive the reference clock signal on line 208 and feedback clock signal on line 406, as shown in FIG. 4. The feedback clock signal is the output clock signal fed back via an optional divide-by-N circuit 214. As discussed above, the counters 210, 212 each receive the system clock signal from the local oscillator 204 and count the number of clock cycles occurring during one cycle of their respective input clock signal. The two counts are provided to the comparator 218 which provides an error signal based on the difference between the two counts. This error signal may be multiplied by a constant gain factor supplied by gain block 414 to produce a "frequency error" signal. In one example, the output of the comparator 218 may be limited to a predetermined maximum amplitude before application of the gain factor. This frequency error signal may be used to lock the frequency of the output clock signal to a multiple of that of the reference clock signal.

Still referring to FIG. 4, the phase locked loop 400 may also include components to generate a "phase error" signal that is used to lock the phase of the feedback clock signal to that of the reference clock signal. The phase locked loop 400 may include a lead/lag detector 408 that receives at its inputs the reference clock signal and the feedback clock signal, as shown. The lead-lag detector 408 may provide an output indicative of the difference in phase between the feedback clock signal and the reference clock signal, this output being termed the phase error signal. The frequency error signal and the phase error signal may be combined in a summer 410 to provide a total error signal that is fed to the frequency synthesizer 202 on line 418.

As discussed above, in one example, the frequency synthesizer 202 may be a direct digital frequency synthesizer and the total error signal may be added to the accumulator constant, $C_A$, of the direct digital frequency synthesizer. Equation (5) provides a minimum number of bits for the width, k, of the accumulator to provide a desired frequency resolution for the loop. However, k may be chosen to be significantly larger than the minimum value given by equation (5) if a stable, low-gain, low-jitter digital phase locked loop is desired. In particular, increasing the value of k may reduce the effective gain of the phase and frequency feedback paths, providing a more stable, low-jitter loop. For example, if the output clock signal is desired to be accurate to +/−1 part-per-million (ppm) at an output clock frequency of 2.048 MHz, a step change of up to 2.048 Hz from the ideal setpoint would be acceptable. If, for example, the local oscillator 204 provides a system clock frequency, $f_s$, of 100 MHz, then k can be calculated from equation (5) to be 25.54. The accumulator width must be an integer (as it is a number of bits); therefore, in this example, k should be at least 26. In some applications, for example, applications using the telecommunications G.823 standard, a very low-jitter output clock signal may be required and therefore, a system clock frequency of 8 kHz may be used as step changes in output frequency contribute to the overall jitter and should be kept small. In this example, an accumulator width, k, of at least 30 may be recommended.

Referring again to FIG. 4, in some embodiments, a gain (from amplifier 414) may be provided in the frequency feedback path. This gain may be selected experimentally to meet desired operating characteristics of the loop response (i.e., how quickly a lock is obtained) and stability. If a faster response to changes in the reference clock frequency is desired, the gain may be increased. In this case, the width, k, of the accumulator may be increased by an equivalent amount in order to maintain the desired frequency resolution given by the following equation:

$$k \geq \frac{\log\left(\frac{f_s * G}{f_{out}}\right)}{\log(2)} \quad (6)$$

Equation (6) corresponds to equation (5) modified by the gain factor, G. For example, if a gain of 16 is used in the frequency feedback path, the accumulator width may be increased by 4. In one example, the gain factor may be selected so as to optimize the jitter response such that the phase locked loop 400 has a desired low frequency jitter transfer function, while allowing a wide enough accumulator to be used to reduce the high frequency jitter transferred by the phase error signal. It is also to be appreciated that, although not illustrated in FIG. 4, there may be applications in which adding a second gain block in the phase feedback path may improve loop response characteristics.

In one embodiment, the lead/lag detector 408 may be controlled to produce a ternary output rather than a signal that is proportional to the measured difference in phase. For example, the lead/lag detector output may be limited such that an error of +1 is output if when the feedback clock is leading the reference clock, while an error of −1 is output if the feedback clock signal lags the reference clock signal, and an error of 0 is output if the rising edges of both the feedback clock signal and the reference clock signal arrive in the same system clock cycle. It is to be appreciated, however, that other limiting values besides +/−1 and 0 may also be used. Limiting the output of the lead/lag detector 408 in this or a similar manner may keep the phase error small and facilitate stability in the loop. Furthermore, by limiting the phase error to a maximum amplitude (e.g., +/−1), the phase locked loop may be designed to be immune to step changes in the phase of the reference clock. This may be useful when switching from one reference clock to another, as may occur, for example, when a line clock fails in a telecommunications system. In addition, by providing a gain in the frequency feedback path and limiting the amplitude of the phase error, the frequency error signal may be made more "dominant." Thus, the loop may first lock the output clock to the frequency of the reference clock, and then gradually align the phase of the two clocks.

Figure 1:
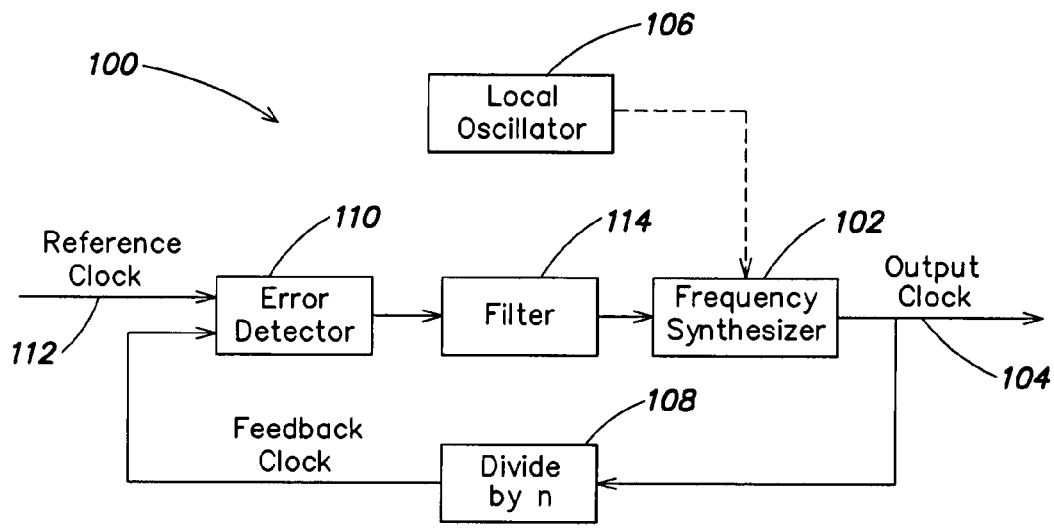
FIG. 1 is a block diagram of a conventional phase-locked loop.

As discussed above with respect to FIG. 1, in conventional phase locked loops, which correct the output clock based on measured phase error, a loop filter is generally required to provide loop stability reduce jitter resulting from the large phase errors that can be measured even when differenced in frequency may be small. By keeping the phase error small, for example, by limiting the output of the lead-lag detector and/or by appropriately selecting the width of the accumulator in the direct digital frequency synthesizer, loop stability may be controlled and jitter reduced. Thus, in embodiments of the phase and/or frequency locked loops, a separate loop filter is not required to modify the error signal or any other part of the frequency and/or phase locked loop feedback path. This reduces the number of calculations required per clock cycle and eliminates the need to store filter coefficients or samples of previous error signals. As a result, the resources used (e.g., space and component count) when implementing a frequency and/or phase locked loop in an FPGA or other digital logic may be reduced.

According to other aspects and embodiments, the frequency and/or phase locked loops may be implemented entirely in digital logic, for example, in an FPGA or custom silicon design. By providing an implementation in an FPGA, the component cost for the digital frequency/phase locked loops may be greatly reduced compared to commercial off-the-shelf products. As discussed above, embodiments of the frequency/phase locked loops described herein may allow very compact implementations in an FPGA, particularly due to the absence of a multiply-accumulate based loop filter, analog components and memory cells. Such a compact implementation may be desirable in many applications and products as is may reduce both the size and cost of systems using frequency/phase locked loops. In addition, the frequency/phase locked loops discussed herein may provide high performance by achieving a frequency lock very quickly over a wide input frequency range, while maintaining excellent loop stability. Thus, embodiments of the frequency/phase locked loops may be desirable in any system that requires locking of a synthesized clock to a reference clock with high accuracy and good high-frequency jitter attenuation.

Figure 5:
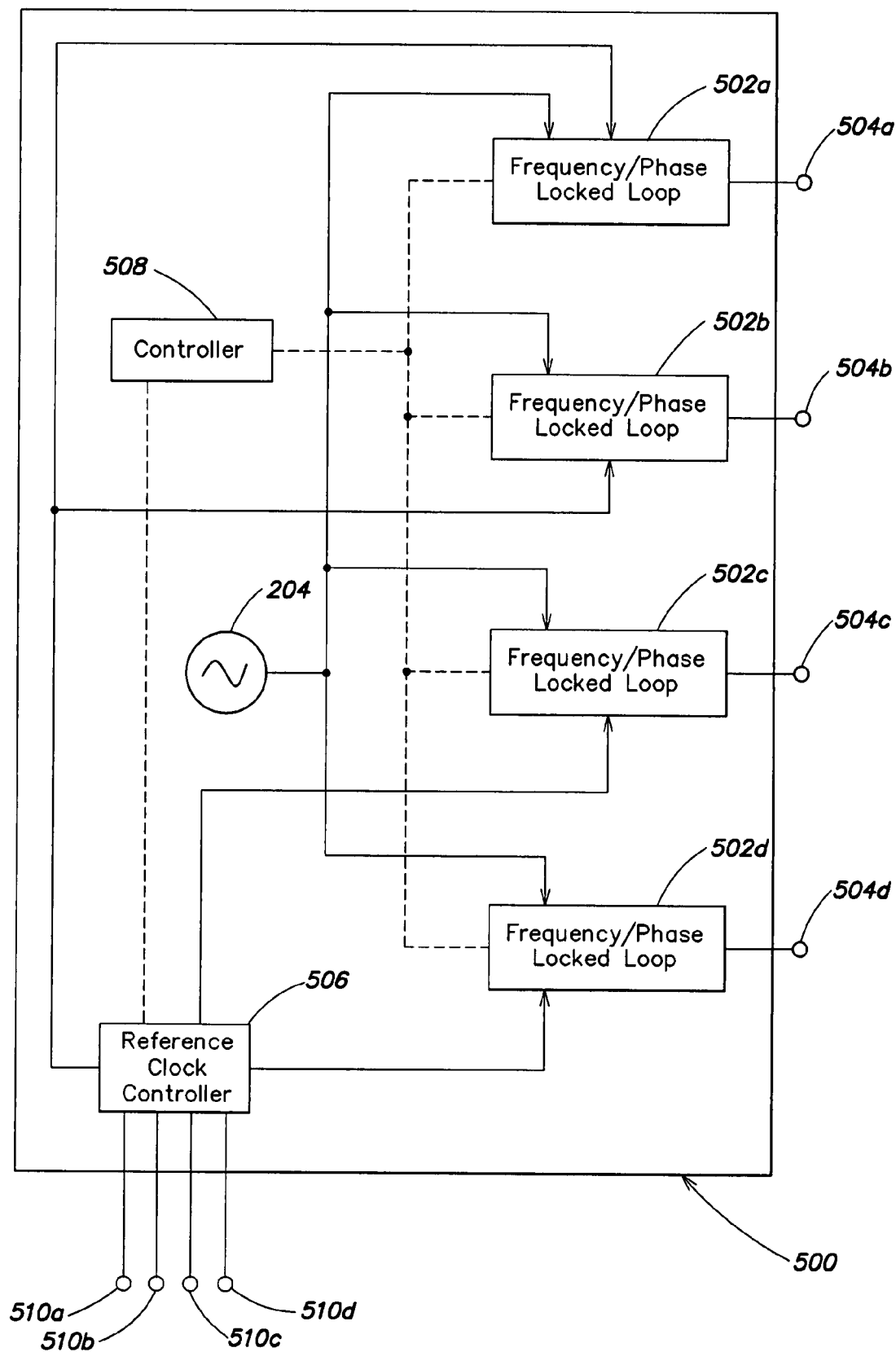
FIG. 5 is a block diagram of a clock control unit comprising filterless phase/frequency locked loops.

One example of a product in which the above-discussed frequency/phase locked loops may be used is a clock control unit used in many telecommunications systems. Referring to FIG. 5, there is illustrated a block diagram of one example of a clock control unit 500 incorporating a plurality of phase/frequency locked loops 502a-502d. The clock control unit 500 comprises a plurality of line outputs 504a-504d. A frequency/phase locked loop 502 is coupled to each of the line outputs 504, as shown. It is to be appreciated that although in the illustrated example, the clock control unit 500 comprises four line outputs 504a-d; the apparatus is not so limited and may be applied to a card having any number of line outputs. In addition, it is to be appreciated that although the clock control unit 500 illustrated in FIG. 5 shows a separate frequency/phase locked loop 502a-d coupled to each individual line output 504a-d, the apparatus is not so limited, and in some examples one or more line outputs 504 may share a common frequency/phase locked loop 502.

The clock control unit 500 may also comprise the local oscillator 204 that provides the system clock signal to the frequency/phase locked loops 502a-d. Again, it is to be appreciated that although only one local oscillator 204 is illustrated, shared by all four frequency/phase locked loops 502a-d, the apparatus is not so limited and the clock control unit 500 may comprise multiple local oscillators 204. Furthermore, a reference clock controller may 506 may be provided that receives one or more reference clock signal(s) and is controlled by controller 508. The reference clock controller 506 may provide the reference clock signals to the frequency/phase locked loops 502*a-d*. In the illustrated example, the reference clock controller 506 is shown receiving four individual reference clock signals via reference clock inputs 510*a-d*, one individual reference clock signal for each frequency/phase locked loop 502. However, it is to be appreciated that the number of reference clock signals input to the reference clock controller 506 depends on the number of frequency/phase locked loops 502 included in a given clock control unit 500, and is thus not limited to four.

The clock control unit 500 may also comprise a controller (e.g., a microprocessor) 508. The microprocessor 508 may be used to configure the appropriate reference input for each frequency/phase locked loop 502*a-d* based on a system requirement, and set the relevant gain and division factor for each frequency/phase locked loop 502*a-d* to produce the desired output clock frequency 504*a-d*. In one embodiment, the majority of the components of the clock control unit 500, including the frequency/phase locked loops 502*a-d*, may be implemented in digital logic, for example, as an FPGA.

Having thus described several aspects of at least one embodiment, it is to be appreciated various alterations, modifications, and improvements will readily occur to those skilled in the art. For example, as discussed above, in embodiments of the phase locked loop, a gain block may be added in the phase feedback path as well as being provided in the frequency feedback path. In another example, multiple output clock frequencies may be generated by tapping the direct digital frequency synthesizer at points or combinations of points other than just the most significant bit of the accumulator. Such and other alterations, modifications, and improvements are intended to be part of this disclosure and are intended to be within the scope of the invention. Accordingly, the foregoing description and drawings are by way of example only and the scope of the invention should be determined from proper construction of the appended claims, and their equivalents.

What is claimed is:

1. A frequency locked loop comprising:
a digital frequency synthesizer having a first synthesizer input and being constructed and arranged to generate an output clock signal;
a first counter having a first counter input to receive a reference clock signal and a second counter input to receive a system clock signal, the first counter being constructed and arranged to provide at a first counter output a first count of a number of periods of the system clock signal within at least one period of the reference clock signal;
a second counter having a third counter input to receive the output clock signal and a fourth counter input to receive the system clock signal, the second counter being constructed and arranged to provide at a second counter output a second count of a number of periods of the system clock signal within at least one period of the output clock signal; and
a comparator coupled to the first and second counter outputs and constructed and arranged to compare the first count with the second count and to provide at a comparator output a frequency error signal based on the comparison,
wherein the comparator output is coupled to the first synthesizer input to provide the frequency error signal to the digital frequency synthesizer; and
wherein the digital frequency synthesizer is constructed and arranged to adjust a frequency of the generated output clock signal based on the frequency error signal.

2. The frequency locked loop as claimed in claim 1, wherein the first count includes a count of the number of periods of the system clock signal between adjacent rising edges of the reference clock signal.

3. The frequency locked loop as claimed in claim 1, wherein the second count includes a count of the number of periods of the system clock signal between adjacent rising edges of the output clock signal.

4. The frequency locked loop as claimed in claim 1, further comprising a local oscillator constructed and arranged to generate the system clock signal.

5. The frequency locked loop as claimed in claim 4, wherein the digital frequency synthesizer comprises a second synthesizer input coupled to the local oscillator to receive the system clock signal.

6. The frequency locked loop as claimed in claim 1, wherein the digital frequency synthesizer comprises a direct digital frequency synthesizer.

7. The frequency locked loop as claimed in claim 1, further comprising a divide-by-N circuit coupled between the output of the digital frequency synthesizer and the third counter input, the divide-by-N circuit being constructed and arranged to receive the output clock signal and to divide the output clock signal by N to provide a feedback clock signal;
wherein the third counter input receives the feedback clock signal; and
wherein the second counter is constructed and arranged to provide at the second counter output the second count of the number of periods of the system clock signal within at least one period of the feedback clock signal.

8. The frequency locked loop as claimed in claim 7, wherein N is an integer.

9. The frequency locked loop as claimed in claim 7, further comprising:
a lead-lag detector having a first input coupled to the output of the divide-by-N circuit to receive the feedback clock signal and a second input to receive the reference clock signal, the lead-lag detector being constructed and arranged to provide at an output a phase error signal; and
an adder coupled between the comparator and the digital frequency synthesizer, the adder being constructed and arranged to receive and add the frequency error signal and the phase error signal and to provide at an adder output a combined error signal;
wherein the digital frequency synthesizer receives the combined error signal at the first synthesizer input and provides the output clock signal based on the combined error signal.

10. The frequency locked loop as claimed in claim 9, further comprising an amplifier coupled between the output of the comparator and the adder, the amplifier being constructed and arranged to provide a constant gain factor to the frequency error signal.

11. The frequency locked loop as claimed in claim 1, wherein the frequency locked loop is implemented in a field programmable gate array.

12. A method comprising:
counting a first number of cycles of a system clock signal within at least one period of a reference signal;
counting a second number of cycles of the system clock signal within at least one period of an output clock signal;
comparing the first number of cycles with the second number of cycles to provide a frequency error signal; and adjusting the output clock signal based on the frequency error signal, wherein adjusting the output clock signal includes adjusting a frequency of the output clock signal.

13. The method as claimed in claim 12, wherein counting the first number of cycles includes counting the first number of cycles occurring between adjacent rising edges of the reference signal.

14. The method as claimed in claim 12, wherein counting the second number of cycles includes counting the second number of cycles occurring between adjacent rising edges of the output clock signal.

15. The method as claimed in claim 12, further comprising:
comparing a first phase of the output clock signal with a second phase of the reference signal to provide a phase error signal.

16. The method as claimed in claim 15, wherein adjusting the output clock signal includes adjusting the frequency and a phase of the output clock signal based on a combination of the frequency error signal and the phase error signal.

17. The method as claimed in claim 15, further comprising multiplying the frequency error signal by a constant gain factor.

18. A frequency and phase locked loop comprising:
a digital frequency synthesizer constructed and arranged to generate an output clock signal;
means for generating a frequency error signal based on a difference in frequency between the output clock signal and a reference signal;
a lead/lag detector constructed and arranged to receive the output clock signal and the reference signal and to generate a phase error signal based on a difference in phase between the output clock signal and the reference signal;
an adder constructed and arranged to receive and add the frequency error signal and the phase error signal to provide a combined error signal; and
an amplifier having an output coupled to an input of the adder and being constructed and arranged to receive the frequency error signal, to apply to the frequency error signal a constant gain factor, and to provide at the output an amplified frequency error signal,
wherein the digital frequency synthesizer is further constructed and arranged to receive the combined error signal and to adjust a frequency and phase of the output clock signal based on the combined error signal.

19. The frequency and phase locked loop as claimed in claim 18, wherein the means for generating the frequency error signal comprises:
a first counter having a first counter input to receive the reference signal and a second counter input to receive a system clock signal, the first counter being constructed and arranged to provide at a first counter output a first count of a number of periods of the system clock signal within one period of the reference signal;
a second counter having a third counter input to receive the output clock signal and a fourth counter input to receive the system clock signal, the second counter being constructed and arranged to provide at a second counter output a second count of a number of periods of the system clock signal within one period of the output clock signal; and
a comparator coupled to the first and second counter outputs and constructed and arranged to compare the first count with the second count and to provide at a comparator output the frequency error signal based on the comparison.

20. A frequency locked loop comprising:
a digital frequency synthesizer having a first synthesizer input and being constructed and arranged to generate an output clock signal;
a first counter having a first counter input to receive a reference clock signal and a second counter input to receive a system clock signal, the first counter being constructed and arranged to provide at a first counter output a first count of a number of periods of the system clock signal within at least one period of the reference clock signal;
a second counter having a third counter input to receive the output clock signal and a fourth counter input to receive the system clock signal, the second counter being constructed and arranged to provide at a second counter output a second count of a number of periods of the system clock signal within at least one period of the output clock signal; and
a comparator coupled to the first and second counter outputs and constructed and arranged to compare the first count with the second count and to provide at a comparator output a frequency error signal based on the comparison,
wherein the comparator output is coupled to the first synthesizer input to provide the frequency error signal to the digital frequency synthesizer,
wherein the digital frequency synthesizer is constructed and arranged to provide the output clock signal based on the frequency error signal, and
wherein at least one of (a) the first count includes a count of the number of periods of the system clock signal between adjacent rising edges of the reference clock signal; and (b) the second count includes a count of the number of periods of the system clock signal between adjacent rising edges of the output clock signal.

* * * * *